(12) United States Patent
Lee et al.

(10) Patent No.: US 10,202,683 B2
(45) Date of Patent: *Feb. 12, 2019

(54) THIN FILM ENCAPSULATION LAYER MANUFACTURING APPARATUS AND METHOD OF MANUFACTURING DISPLAY APPARATUS USING THE SAME

(71) Applicant: SAMSUNG DISPLAY CO., LTD., Yongin, Gyeonggi-Do (KR)

(72) Inventors: Yong-Suk Lee, Yongin (KR); Min-Sung Seo, Yongin (KR); Myung-Soo Huh, Yongin (KR); Mi-Ra An, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 106 days.

This patent is subject to a terminal disclaimer.

(21) Appl. No.: 14/296,826

(22) Filed: Jun. 5, 2014

(65) Prior Publication Data

US 2015/0047969 A1 Feb. 19, 2015

(30) Foreign Application Priority Data

Aug. 16, 2013 (KR) .................. 10-2013-0097323

(51) Int. Cl.
*C23C 14/56* (2006.01)
*C23C 16/54* (2006.01)
(Continued)

(52) U.S. Cl.
CPC ............ *C23C 14/568* (2013.01); *C23C 16/54* (2013.01); *H01L 21/67184* (2013.01); *H01L 21/67207* (2013.01); *H01L 51/5256* (2013.01)

(58) Field of Classification Search
CPC ........ C23C 14/568; C23C 14/34; C23C 16/54; H01L 21/67184; H01L 21/67207; H01L 51/5256

See application file for complete search history.

(56) References Cited

U.S. PATENT DOCUMENTS 6,279,373 B1 * 8/2001 Kenney ................ G01L 27/002
73/1.63
2003/0162314 A1 * 8/2003 Yamazaki ............... C23C 14/12
438/46

(Continued)

FOREIGN PATENT DOCUMENTS

JP 06-140492 A 5/1994
KR 10-2004-0104005 A 12/2004
(Continued)

OTHER PUBLICATIONS

Machine translation of KR20120043571.*

*Primary Examiner* — Michael A Band
(74) *Attorney, Agent, or Firm* — Lee & Morse, P.C.

(57) ABSTRACT

A thin film encapsulation layer manufacturing apparatus is provided that may include a transfer chamber, a sputtering chamber, a monomer deposition chamber, a chemical vapor deposition (CVD) chamber, and an atomic layer deposition (ALD) chamber. The transfer chamber may be connected to each of the other chambers, and may be configured to align a substrate. Each of the other chambers may be configured to receive from and transfer to the transfer chamber a substrate. The sputtering chamber may be configured to form a first inorganic layer on the substrate by a sputtering process. The monomer deposition chamber may be configured to deposit a first organic layer on the first inorganic layer. The CVD chamber may be configured to form a second inorganic layer on the first organic layer. The ALD
(Continued)

chamber may be configured to form a third inorganic layer on the second inorganic layer.

3 Claims, 4 Drawing Sheets

(51) Int. Cl.
    *H01L 21/67*     (2006.01)
    *H01L 51/52*     (2006.01)

(56) References Cited

U.S. PATENT DOCUMENTS

2006/0121309 A1*   6/2006   D'Andrade ......... H01L 51/5016
                                                                                                                                           428/690
2008/0236495 A1*  10/2008   Tompa ............... C23C 16/45565
                                                                                                                                           118/724
2009/0191342 A1*   7/2009   Chu ...................... H01L 23/564
                                                                                                                                                  427/264
2011/0140164 A1*   6/2011   Seo ..................... H01L 51/5256
                                                                                                                                                   257/100

FOREIGN PATENT DOCUMENTS

| KR | 10-2006-0115045 A | 11/2006 |
| KR | 10-2010-0087514 A | 8/2010 |
| KR | 10-2012-0043571 A | 5/2012 |
| KR | 10-2012-0074419 A | 7/2012 |

* cited by examiner

THIN FILM ENCAPSULATION LAYER MANUFACTURING APPARATUS AND METHOD OF MANUFACTURING DISPLAY APPARATUS USING THE SAME

CROSS-REFERENCE TO RELATED APPLICATION

The present application claims priority under 35 U.S.C. § 119 to Korean Patent Application No. 10-2013-0097323, filed on Aug. 16, 2013, in the Korean Intellectual Property Office, and entitled: "Thin Film Encapsulation Layer Manufacturing Apparatus and Method Of Manufacturing Display Apparatus Using The Same," which is incorporated by reference herein in its entirety.

BACKGROUND

1. Field

Embodiments relate to an apparatus and a manufacturing method, for example, a thin film encapsulation layer manufacturing apparatus and a method of manufacturing a display apparatus using the same.

2. Description of the Related Art

Mobile electronic devices are widely used including small-sized electronic device, such as mobile phones and tablet PCs. Such mobile electronic devices include a display apparatus to support various functions and provide visual information, such as an image or a video. As compartments for operating the display apparatus are miniaturized, the role of the display unit in electronic devices increases. A display apparatus having a structure able to be curved to a predetermined angle from a flat state has been developed. For example, a light-emitting unit of the display apparatus may be encapsulated with a multi-layered thin film in consideration of lifespan or the like. In the encapsulation process, a thin film encapsulation layer may be formed by alternately stacking an organic layer and an inorganic layer by various methods.

SUMMARY

Embodiments are directed to a thin film encapsulation layer manufacturing apparatus including a first transfer chamber, a sputtering chamber, a monomer deposition chamber, a chemical vapor deposition (CVD) chamber, and an atomic layer deposition (ALD) chamber. The first transfer chamber may be configured to align a substrate. The sputtering chamber may be connected to the first transfer chamber, configured to receive the substrate from the first transfer chamber, and to form a first inorganic layer on the substrate by a sputtering process. The monomer deposition chamber may be connected to the first transfer chamber and configured to receive the substrate from the transfer chamber, and to deposit a first organic layer on the first inorganic layer. The chemical vapor deposition (CVD) chamber connected to the first transfer chamber, and configured to receive the substrate from the first transfer chamber, and to form a second inorganic layer on the first organic layer. The atomic layer deposition (ALD) chamber may be connected to the first transfer chamber, and configured to receive the substrate from the first transfer chamber, and to form a third inorganic layer on the second inorganic layer.

The sputtering chamber and the monomer deposition chamber may be configured to downwardly deposit the first inorganic layer and the first organic layer, respectively. The chemical vapor deposition chamber and the atomic layer deposition chamber may be configured to upwardly deposit the second inorganic layer and the third inorganic layer, respectively.

The thin film encapsulation layer manufacturing apparatus may further include a first flip chamber connected to the first transfer chamber, and configured to receive the substrate from the first transfer chamber, to invert the substrate, and to transfer the substrate to first transfer chamber. The first flip chamber may include a first chamber body unit having a space formed therein and an opening configured for insertion or withdrawal of the substrate. The first clamping unit within the first chamber body unit may be configured to clamp or release the substrate. The substrate rotating unit may be configured to rotate the substrate clamped by the first clamping unit. The first clamping unit may be configured to be driven in a first direction, and the substrate rotating unit may be configured to be driven in a second direction perpendicular to the first direction. The first flip chamber may further include a first door in the first chamber body unit configured to rotatably open and close the opening.

A thin film encapsulation layer manufacturing apparatus may include a first transfer chamber, a sputtering chamber, a monomer deposition chamber, a second transfer chamber, and a chemical vapor deposition (CVD) chamber, and an atomic layer deposition (ALD) chamber. The first transfer chamber may be configured to align a substrate. The sputtering chamber may be connected to the first transfer chamber, and configured to receive the substrate from the first transfer chamber, and to form a first inorganic layer on the substrate by a sputtering process. The monomer deposition chamber may be connected to the first transfer chamber and configured to receive the substrate from the transfer chamber, and to deposit a first organic layer on the first inorganic layer. The second transfer chamber may be connected to the first transfer chamber and configured to align the substrate. The chemical vapor deposition (CVD) chamber may be connected to the second transfer chamber, and configured to receive the substrate from the second transfer chamber, and to form a second inorganic layer on the first organic layer. The atomic layer deposition (ALD) chamber may be connected to the second transfer chamber, and configured to receive the substrate from the second transfer chamber, and to form a third inorganic layer on the second inorganic layer.

The thin film encapsulation layer manufacturing apparatus may further include a first flip chamber connecting the first transfer chamber and the second transfer chamber, and configured to receive the substrate from the first transfer chamber, to invert the substrate, and to transfer the substrate to the second transfer chamber. The first flip chamber may include a first chamber body unit having a space formed therein and an opening configured for insertion or withdrawal of the substrate. A first clamping unit within the first chamber body unit may be configured to clamp or release the substrate. The substrate rotating unit may be configured to rotate the substrate clamped by the first clamping unit.

The thin film encapsulation layer manufacturing apparatus may further include a second flip chamber connected to the second transfer chamber, and configured to receive the substrate from the second transfer chamber, to invert the substrate, and to transfer the substrate to the second transfer chamber. The second flip chamber may include a second chamber body unit having a space formed therein and a second opening configured for insertion or withdrawal of the substrate, a second clamping unit within the second chamber body unit configured to clamp or release the substrate, and a second substrate rotating unit configured to rotate the substrate clamped by the second clamping unit.

The sputtering chamber and the monomer deposition chamber may be arrayed around a first perimeter of the first transfer chamber to define a first cluster. The CVD chamber and the ALD chamber may be arrayed around a second perimeter of the second transfer chamber to define a second cluster.

A method of manufacturing a display apparatus may include the following. A first inorganic layer may be formed on a substrate through a sputtering process in a sputtering chamber. The substrate may be transferred from the sputtering chamber into a monomer deposition chamber. A first organic layer may be formed on the first inorganic layer through a monomer deposition process in the monomer deposition chamber. The substrate may be transferred from the monomer deposition chamber into a chemical vapor deposition (CVD) chamber. A second inorganic layer may be formed on the first organic layer through a CVD process in the CVD chamber. The substrate may be transferred from the CVD chamber into an atomic layer deposition (ALD) chamber. A third inorganic layer may be formed on the second inorganic layer through an ALD process in the ALD chamber.

The transferring steps may be performed using at least one transfer chamber. The substrate may be inverted in a first flip chamber, transferred into the at least one transfer chamber, and transferred into the chemical vapor deposition chamber. The first inorganic layer and the first organic layer may be formed by downward deposition. The second inorganic layer and the third inorganic layer may be formed by upward deposition.

The method may further include inverting the substrate after the forming of the first organic layer. The method may further include inverting the substrate after the forming of the third inorganic layer. The method may be performed using a thin film encapsulation layer manufacturing apparatus described herein.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
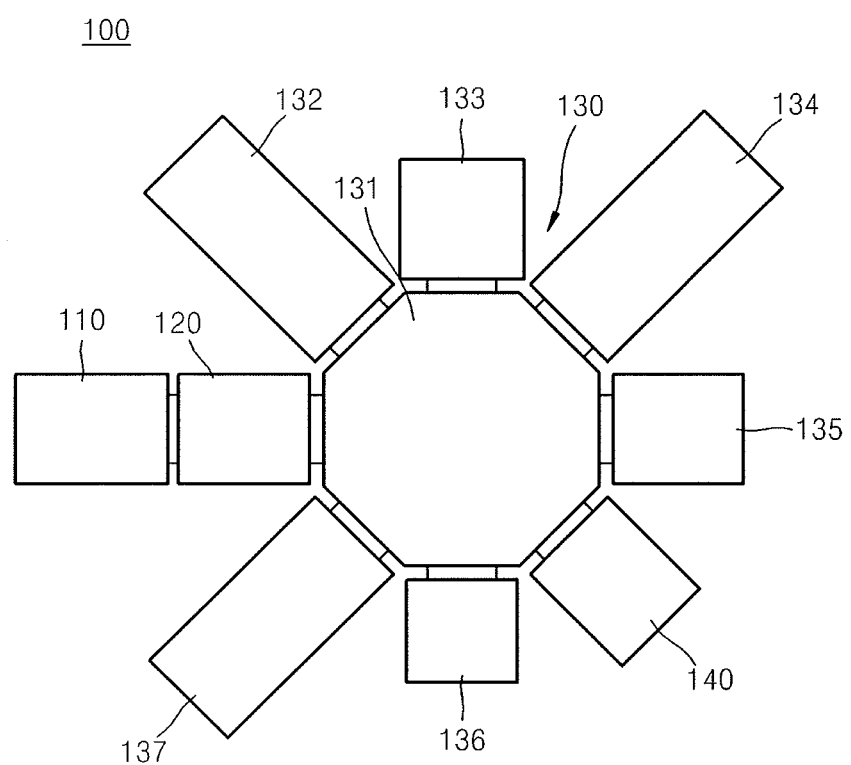
FIG. 1 illustrates a schematic view of a thin film encapsulation layer manufacturing apparatus.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Although the terms "first," "second," and the like may be used herein to describe various components, these components should not be limited by these terms. These components are only used to distinguish one component from another. As used herein, the singular forms "a," "an," and "the" are intended to include the plural forms as well, unless the context clearly indicates otherwise. The terms "comprises" and/or "comprising" used herein specify the presence of stated features or components in various embodiments, but do not preclude the presence or addition of one or more other features or components in various embodiments.

When a layer, region, or component is referred to as being "formed on" another layer, region or component, it can be directly or indirectly formed on the other layer, region, or component. That is, for example, intervening layers, regions, or components may be present. Sizes of elements in the drawings may be exaggerated for convenience of explanation. Because sizes and thicknesses of components in the drawings are arbitrarily illustrated for convenience of explanation, the following embodiments are not limited thereto. When a certain embodiment may be implemented differently, a specific process order may be performed differently from the described order. For example, two consecutively described processes may be performed substantially at the same time or performed in an order opposite to the described order.

Figure 2:
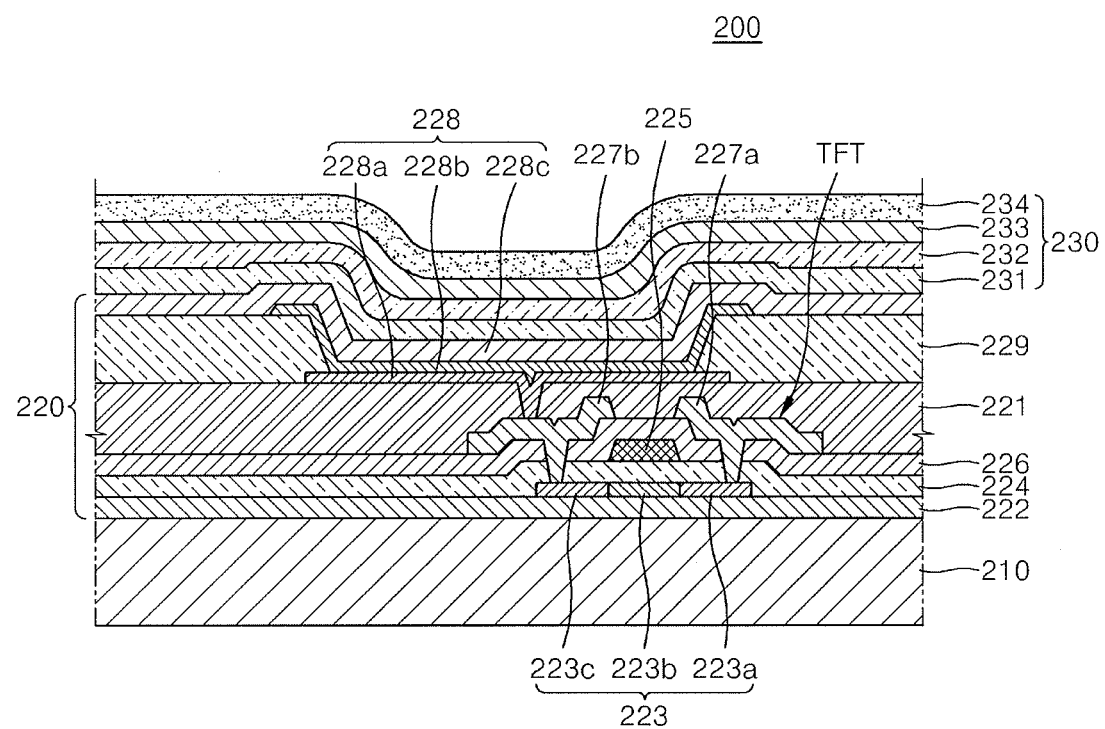
FIG. 2 illustrates a cross-sectional view of a display apparatus manufactured using the thin film encapsulation layer manufacturing apparatus in FIG. 1.
Figure 3:
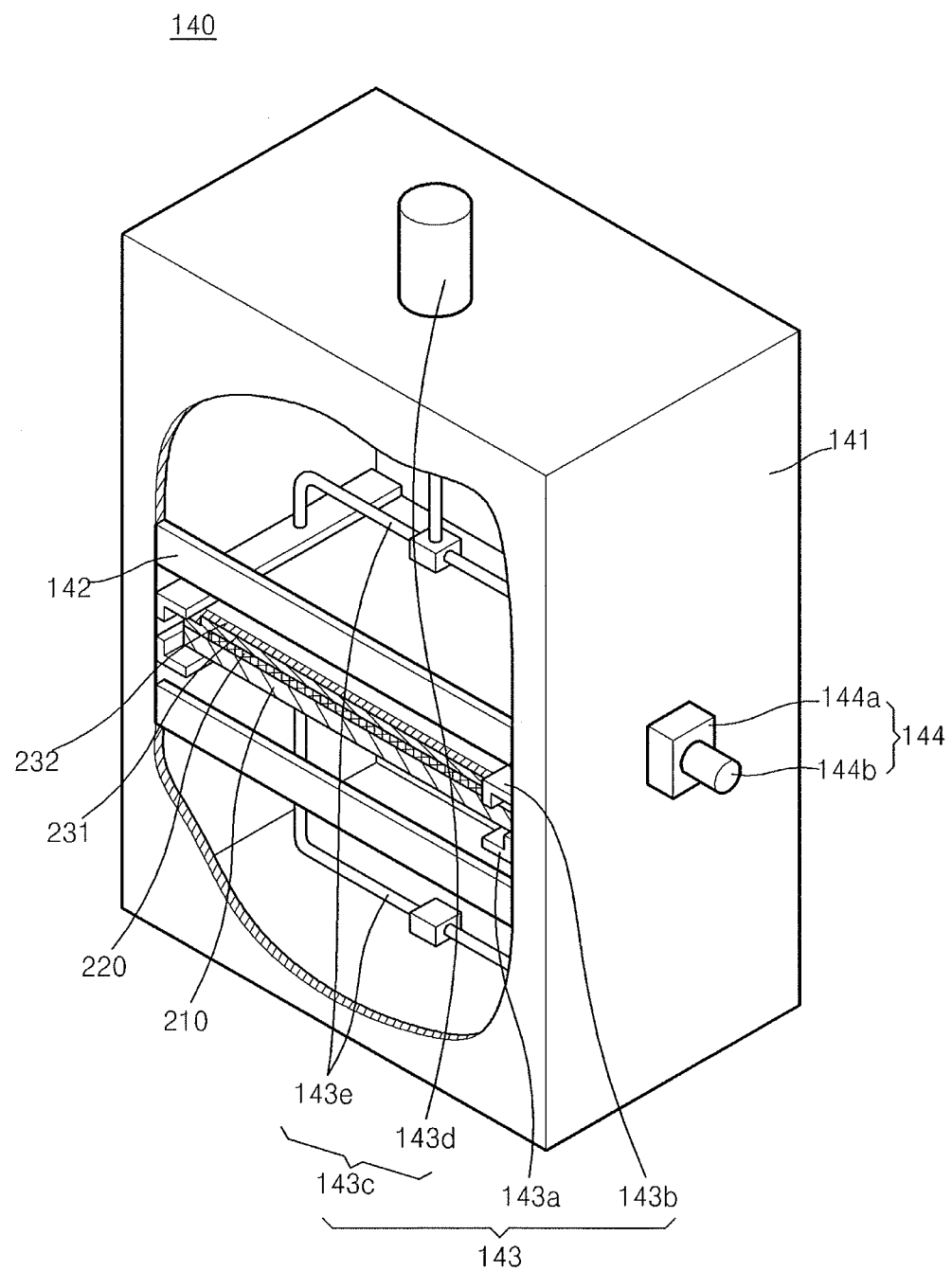
FIG. 3 illustrates a schematic view of the first flip chamber in FIG. 1.

FIG. 1 illustrates a schematic view of a thin film encapsulation layer manufacturing apparatus 100. FIG. 2 illustrates a cross-sectional view of a display apparatus 200 that may be manufactured using the thin film encapsulation layer manufacturing apparatus 100 illustrated in FIG. 1. FIG. 3 illustrates a schematic view of a first flip chamber 140 illustrated in FIG. 1. Referring to FIGS. 1 through 3, the thin film encapsulation layer manufacturing apparatus 100 may form a single cluster, and may form a thin film encapsulation layer 230 on a substrate 210 formed with a light-emitting unit 220.

The thin film encapsulation layer manufacturing apparatus 100 may include a loading chamber 110 into which the substrate 210 formed with the light-emitting unit 220 is introduced from outside of the apparatus. The loading chamber 110 may store the substrate 210 formed with the light-emitting unit 220 and load the substrate 210 to a first buffer chamber 120. The thin film encapsulation layer manufacturing apparatus 100 may include the first buffer chamber 120 connected to the loading chamber 110. The first buffer chamber 120 may be provided with a shuttle or a carrier in order to move the substrate 210 formed with the light-emitting unit 220.

The thin film encapsulation layer manufacturing apparatus 100 may include a first cluster 130 connected to the first buffer chamber 120. The first cluster 130 may include a first transfer chamber 131. The first cluster 130 may include a sputtering chamber 132 connected to the first transfer chamber 131 to form a first inorganic layer 231 through a sputtering process. The first cluster 130 may include a monomer deposition chamber 134 connected to the first transfer chamber 134 to form a first organic layer 232 through a flash evaporation process. The monomer deposition chamber 134 may form the first organic layer 232 through a flash evaporator.

The first cluster 130 may include a chemical vapor deposition chamber 136 connected to the first transfer chamber 136 to form a second inorganic layer 233 through a chemical vapor deposition process. The chemical vapor deposition chamber 136 may form the second inorganic layer 233 by performing a general chemical vapor deposition (CVD) process or a plasma enhanced chemical vapor deposition (PECVD) process. The first cluster 130 may include an atomic layer deposition chamber 137 connected to the first transfer chamber 136 to form a third inorganic layer 234 through an atomic layer deposition (ALD) process.

The first cluster 130 may include a first mask stock chamber storing a mask for a deposition process, which may be performed in at least one of the sputtering chamber 132, the monomer deposition chamber 134, the CVD chamber 136, and the ALD chamber 137. The first mask stock chamber 133 may be provided in plurality, and each of the plurality of first mask stock chambers 133 may independently store masks for the sputtering chamber 132, the monomer deposition chamber 134, the CVD chamber 136, and the ALD chamber 137. However, for convenience of explanation, detailed description is made mainly with reference to the case where the first mask stock chamber 133 stores all the masks for the sputtering chamber 132, the monomer deposition chamber 134, the CVD chamber 136, and the ALD chamber 137.

The first cluster 130 may include a second buffer chamber 135 connected to the first transfer chamber 131. The second buffer chamber 135 may temporarily store the substrate 210 formed with the light-emitting unit 220, or may control the inner pressure thereof when inner pressures of other chambers are different from the process pressure.

The first cluster 130 may include a first flip chamber 140 inverting the substrate 210 formed with the light-emitting unit 220 connected to the first transfer chamber 131. The first flip chamber 140 may include a first chamber body unit 141 having a space formed therein. The first chamber body unit 141 may have an opening through which the substrate 210 formed with the light-emitting unit 220 is introduced. The first flip chamber 140 may include a first door 142 which is installed in the first chamber body unit 141 to open/close the opening. The first flip chamber 140 may include a first clamping unit 143, which may be installed within the first chamber body unit 141 to clamp or release the substrate 210.

The first clamping unit 143 may include a first clamp 143a supporting the substrate 210, and a second clamp 143b which is disposed to face the first clamp 143a and is movably installed on an inner surface of the first chamber body unit 141. The first clamping unit 143 may include a first linear driving unit 143c selectively linearly moving the first clamp 143a or the second clamp 143b. The linear driving unit 143c may be formed variously. For example, the first linear driving unit 143c may be provided with a first motor, a first linear moving unit, which may be linearly moved by rotation of the first motor, and a first connecting member 143e connected to the first linear moving member and the first clamp 143a, or the first linear moving member and the second clamp 143b. The first connecting member 143e and the first linear moving member may be connected so as to be selectively separable. The first linear driving unit 143c may include a first cylinder 143d, and a first connecting member 143e selectively coupled to the first cylinder 143d.

The first linear driving unit 143c may have other configurations, and may include any or all apparatuses to selectively linearly move the first clamp 143a or the second clamp 143b. For convenience of explanation, detailed description is made mainly with reference to the case where the first linear driving unit 143c includes the first cylinder 143d and the first connecting member 143e. The first flip chamber 140 may include a substrate rotating unit 144 rotating the substrate 210 clamped by the first clamping unit 143. The first clamping unit 143 may be driven in a first direction, and the substrate rotating unit 144 may be driven in a second direction perpendicular to the first direction. The substrate rotating unit 144 may include a first rotation driving unit 144a in order to rotate the substrate 210. The first rotation driving unit 144a may be provided with a motor generating a rotational force. The substrate rotating unit 144 may be provided with a first force applying unit 144b contacting one of the first clamp 143a and the second clamp 143b with a first rotational shaft. The first force applying unit 144b may be provided with a cylinder, and contact one of the first clamp 143a and the second clamp 143b with the first rotational shaft by changing its length through the cylinder.

The thin film encapsulation layer manufacturing apparatus 100 may include an unloading chamber, which may receive the substrate 210 from the first transfer chamber 131 and unload the substrate 210 to outside of the apparatus. The unloading chamber may be formed integrally with, or separately from the loading chamber 110. In the case where the unloading chamber is formed separately from the loading chamber 110, for example, the unloading chamber may be connected to the first transfer chamber 131 and a third buffer chamber, or may be connected to the second buffer chamber 135. However, for convenience of explanation, detailed description is made mainly with reference to the case where the unloading chamber is formed integrally with the loading chamber 110.

A display apparatus 200 may be manufactured by forming a thin film encapsulation layer 230 on the substrate 210 formed with the light-emitting unit 220 by using the thin film encapsulation layer manufacturing apparatus 100. The display apparatus 200 may be formed in various forms. For example, the display apparatus 200 may include a liquid crystal display apparatus, a plasma display apparatus, an organic light-emitting display apparatus, or the like. However, for convenience of explanation, detailed description is made mainly with reference to the case where the display apparatus 200 includes an organic light-emitting display apparatus.

First, a light-emitting unit 220 may be formed on a substrate 210. The light-emitting unit 200 may include a thin film transistor (TFT), a passivation layer 221 covering the TFT, and an organic light-emitting device (OLED) formed on the passivation layer 221. The substrate 210 may include, for example, a glass material, and the substrate 210 may include, for example, a plastic material, or a metal material such as stainless steel (SUS), or titanium (Ti). A buffer layer 222 including an organic compound and/or an inorganic compound, such as SiOx (x≥1), or SiNx (≥1) is further formed on the substrate 210.

An active layer 223 having a predetermined pattern is formed on the buffer layer 222 and is then buried by a gate insulating layer 224. The active layer 223 may include a source region 223a, a drain region 223c, and a channel region 223b between the source region 223a and the drain region 223c. The active layer 223 may include a variety of materials. For example, the active layer 223 may include an inorganic semiconductor material such as amorphous silicon or crystalline silicon. The active layer 223 may include an oxide semiconductor material. The active layer 223 may include an organic semiconductor material. However, for convenience of explanation, detailed description is made mainly with reference to the case where the active layer 223 is formed of amorphous silicon. The active layer 223 may be formed by forming an amorphous silicon layer on the buffer layer 222, crystallizing the amorphous silicon layer to form a polycrystalline silicon layer, and patterning the polycrystalline silicon layer. The source region 223a and the drain region 223c of the active layer 223 may be doped with impurities according to types of TFTs, i.e., according to whether the TFT is a drive TFT, or a switching TFT.

A gate electrode 225 corresponding to the active layer 223, and an interlayer insulating layer 226 covering the active layer 223 may be formed on the gate insulating layer 224. A contact hole may be formed in the interlayer insulating layer 226 and the gate insulating layer 224, and then a source electrode 227*a* and a drain electrode 227*b* may be formed on the interlayer insulating layer 226 such that the source electrode 227*a* and the drain electrode 227*b* contact the source region 223*a* and the drain region 223*c*, respectively. Because a reflective layer is formed simultaneously with the formation of the source electrode 227*a* and the drain electrode 227*b*, the source electrode 227*a* and the drain electrode 227*b* may be formed of a material having good electrical conductivity to a thickness that is able to reflect light.

A passivation layer 221 may be formed on the thin film transistor and the reflective layer, and a pixel electrode 228*a* of an OLED may be formed on the passivation layer 221. The pixel electrode 228*a* may be in contact with the drain electrode 227*b* through a via hole formed in the passivation layer 221. The passivation layer 221 may be formed of an inorganic material and/or an organic material, of a single layer or two or more layers, and may be formed of a planarization layer planarizing the top surface thereof regardless of a curved state of the underlying layer, or formed conformally with a curved state of the underlying layer. The passivation layer 221 may be formed of a transparent insulating material in order to achieve resonance effect.

After the pixel electrode 228*a* is formed on the passivation layer 221, a pixel defining layer 229 may be formed of an organic material and/or an inorganic material in order to cover the pixel electrode 228*a* and the passivation layer 221, and then may be opened in order to expose the pixel electrode 228*a*. An intermediate layer 228*b* and an opposite electrode 228*c* may be formed at least on the pixel electrode 228*a*. The pixel electrode 228*a* may function as an anode electrode, and the opposite electrode 228*c* may function as a cathode electrode, or vice versa. The pixel electrode 228*a* and the opposite electrode 228*c* may be insulated from each other by the intermediate layer 228*b*, and an organic emission layer may emit light when voltages having different polarities from each other are applied to the intermediate layer 228*b*. The intermediate layer 228*b* may include an organic emission layer. The intermediate layer 228*b* may include, for example an organic emission layer and may further include at least one of a hole injection layer (HIL), a hole transport layer (HTL), an electron transport layer (ETL), and an electron injection layer (HIL). The intermediate layer 228*b* may include an inorganic emission layer and may further include other various functional layers.

A unit pixel may include a plurality of sub-pixels that may emit lights of various colors. For example, the sub-pixels may include sub-pixels that emit lights of red, green, and blue colors or sub-pixels that emit lights of red, green, blue, and white colors. The sub-pixels may include intermediate layers 228*b* having organic emission layers that emit lights of various colors. For example, the sub-pixels may include intermediate layers having organic emission layers that emit lights of red, green, and blue colors. The sub-pixels that may emit lights of various colors may include intermediate layers that may emit lights of the same color, for example, white, and may include a color converting layer or a color filter that may convert the white light into a light of a predetermined color.

The intermediate layer 228*b* emitting the white light may have a variety of structures, for example, a structure in which at least a light-emitting substance emitting a red light, a light-emitting substance emitting a green light, and a light-emitting substance emitting a blue light are stacked on one another. The intermediate layer may include a structure in which at least a light-emitting substance emitting a red light, a light-emitting substance emitting a green light, and a light-emitting substance emitting a blue light are mixed. The red, green, and blue colors are exemplary; other colors may be used additionally or in the alternative in any suitable combination and/or number. In other words, any combination of other various colors, which is capable of emitting a white light, may be employed in addition to a combination of red, green, and blue After the substrate 210 formed with the light-emitting unit 220 is prepared, the substrate 210 may be introduced into the thin film encapsulation layer manufacturing apparatus 100 to form a thin film encapsulation layer 230. The thin film encapsulation layer 230 may include a plurality of inorganic layers, or an inorganic layer and an organic layer. The organic layer of the thin film encapsulation layer 230 may be formed of a polymer, and may be a single layer or a layer stack formed of any one of polyethylene terephthalate, polyimide, polycarbonate, epoxy, polyethylene, and polyacrylate. The organic layer may be formed of polyacrylate, and in detail, may include a polymerized monomer composition including diacrylate-based monomer and triacrylate-based monomer. The monomer composition may further include monoacrylate-based monomer. The monomer composition may further include, for example, a suitable photoinitiator such as trimethyl benzoyl diphenyl phosphine oxide (TPO).

The inorganic layer of the thin film encapsulation layer 230 may be a single layer or a layer stack including a metal oxide or a metal nitride. In detail, the inorganic layer may include any one of $SiNx$, $Al_2O_3$, $SiO_2$, and $TiO_2$. The top layer of the thin film encapsulation layer 230 that is exposed to the outside may be formed of an inorganic layer in order to prevent intrusion of moisture into the organic light-emitting device. The thin film encapsulation layer 230 may include at least one sandwich structure in which at least one organic layer is inserted between at least two inorganic layers. The thin film encapsulation layer 230 may include at least one sandwich structure in which at least one inorganic layer is inserted between at least two organic layers. The thin film encapsulation layer 230 may include a sandwich structure in which at least one organic layer is inserted between at least two inorganic layers and a sandwich structure in which at least one inorganic layer is inserted between at least two organic layers. The thin film encapsulation layer 230 may include a first inorganic layer 231, a first organic layer 232, and a second inorganic layer 233 sequentially formed from the top portion of the organic light-emitting device (OLED). The thin film encapsulation layer 230 may include a first inorganic layer 231, a first organic layer a second inorganic layer 233, a second organic layer, and a third inorganic layer 234 sequentially formed from the top portion of the OLED. The thin film encapsulation layer 230 may include a first inorganic layer 231, a first organic layer 232, a second inorganic layer 233, a second organic layer, a third inorganic layer 234, a third organic layer, and a fourth inorganic layer sequentially formed from the top portion of the OLED. The thin film encapsulation layer 230 may include a first inorganic layer 231, a first organic layer 232, a second inorganic layer 233, and a third inorganic layer 234 sequentially formed on the top portion of the OLED.

For convenience of explanation, detailed description is made mainly with reference to the case where the thin film encapsulation layer 230 includes a first inorganic layer 231, a first organic layer 232, a second inorganic layer 233, and a third inorganic layer 234. A halogenated metal layer including lithium fluoride (LiF) may be additionally included between the OLED and the first inorganic layer 231. The halogenated metal layer may prevent the OLED from being damaged when the first inorganic layer 231 is formed in a sputtering method. The first organic layer 232 may be smaller than the second inorganic layer 233, and the second organic layer may be smaller than the third inorganic layer 234. The first organic layer 232 may be completely covered by the second inorganic layer 233, and the second organic layer may be completely covered by the third inorganic layer 234.

For convenience of explanation, detailed description is made with reference to the case where the thin film encapsulation layer 230 includes the first inorganic layer 231, the first organic layer 232, the second inorganic layer 233, and the third inorganic layer 234 which may be formed sequentially. A method of forming a thin film encapsulation layer, for example, the thin film encapsulation layer 230, may include the following. After the thin film encapsulation layer manufacturing apparatus 100 is maintained at a vacuum degree of, e.g., 5E-4 Pa or less, masks may be transferred from the first mask stock chamber 133 into the sputtering chamber 132, the monomer deposition chamber 134, the CVD chamber 136, and the ALD chamber using a robot arm and then mounted within each of the chambers. The masks may be supplied in advance to the respective chambers before a process is performed. However, for convenience of explanation, detailed description is made with reference to the case where the masks are supplied in advance to the respective chambers.

Thereafter, a substrate 210 may be introduced into the loading chamber 110 from the outside. At this time, the substrate may be in a state where the light-emitting unit 220 may be formed. When the substrate 210 is introduced, for example, the loading chamber 110 may transfer the substrate 210 into the first buffer chamber 120. Before the substrate 210 is transferred into the first buffer chamber 120, the loading chamber 110 and the first buffer chamber 120 may be maintained at the same inner pressure. After the preceding operation is completed, the inner pressure of the first buffer chamber 120 may be made to correspond to the inner pressure of the first transfer chamber 131, a gate valve is opened, and then the substrate 210 may be transferred from the first buffer chamber 120 into the first transfer chamber 131. At this time, the substrate 210 may be transferred using a shuttle, a carrier, a robot arm, or the like.

The substrate 210 transferred into the first transfer chamber 131 may be aligned in position within the first transfer chamber 131. The position alignment of the substrate 210 may be performed using a robot arm. The substrate 210 may be aligned in a position corresponding to a preset position. After the position of the substrate 210 is aligned, an inner pressure of the sputtering chamber 132 may be made to correspond to the inner pressure of the first transfer chamber 131, and then the substrate 210 may be transferred from the first transfer chamber 131 into the sputtering chamber 132. The sputtering chamber 132 may form a first inorganic layer 231 on the light-emitting unit 220. The substrate 210 may be installed between the previously installed mask and a substrate holder, precisely aligned by using a mark of the substrate 210 and an open mark of the mask by an aligning tool having a vision connected thereto, and then being attached with the mask. At this time, a process gas for sputtering may be injected into the sputtering chamber 132 and a voltage may be applied to a cathode to form plasma discharge while the sputtering chamber 132 may be maintained at a vacuum degree ranging from about 1E-1 to about 1E-2 Pa. While the substrate 210 or the cathode is moved within the sputtering chamber 132, a deposition process may be performed.

While the preceding process is performed, when the thickness of the first inorganic layer 231 reaches a target thickness, for example, the substrate 210 or the cathode may be moved to a standby region to stop discharge and injection of the process gas, and then the vacuum degree of the sputtering chamber 132 may be maintained the same as that of the first transfer chamber 131 by controlling conductance of a vacuum exhaust system. At this time, the substrate 210 may be detached from the mask and then moved to a position where the substrate 210 may be discharged.

When the first inorganic layer 231 is formed, and then the inner pressure of the sputtering chamber 132 may be made to correspond to the inner pressure of the first transfer chamber 131, the substrate 210 may be transferred from the sputtering chamber 132 into the first transfer chamber 131. The substrate 210 transferred into the first transfer chamber 131 may be transferred into the monomer deposition chamber 134 in a state that the inner pressure of the first transfer chamber 131 may be maintained the same as that of the monomer deposition chamber 134. At this time, the substrate 210 may be loaded between the previously installed mask and a substrate holder, precisely aligned by using a mark of the substrate 210 and an open mark of the mask by an aligning tool having a vision connected thereto, and then attached with the mask.

A process gas may be injected into the monomer deposition chamber 134 where a monomer deposition process may be performed while the monomer deposition chamber 134 may be maintained at a vacuum degree ranging from about 1E-1 to about 1E-2 Pa, and a nozzle unit of an evaporator containing an organic material may be opened. At this time, deposition and curing processes may be performed within the monomer deposition chamber 134 while the substrate 210 or a source unit is moved. The monomer deposition chamber 134 may form a first organic layer 232 on the first inorganic layer 231 of the transferred substrate 210. When the substrate is loaded into the monomer deposition chamber 134, for example, a monomer and a photoinitiator that may be polymerized by UV or heat may be deposited through a flash evaporator.

When the process is completed, the polymer type of first organic layer 232 may be formed by applying heat to a surface where the monomer may be deposited such that the monomer is cured and polymerized. While the process is performed, when the thickness of the first organic layer 232 reaches a target thickness, the substrate 210 or the source unit may be moved to a standby region, the nozzle unit may be closed, the introduction of the process gas may stop, conductance of the vacuum exhaust system may be controlled such that the vacuum degree of the monomer deposition chamber 134 may be maintained the same as that of the first transfer chamber 131. The substrate 210 may be detached from the mask and then may be moved to a position where the substrate 210 may be discharged.

When the inner pressure of the monomer deposition chamber 134 is made to be the same as that of the first transfer chamber 131, for example, the substrate 210 may be formed with the first organic layer 232 may be transferred from the monomer deposition chamber 134 into the first transfer chamber 131. The inner pressure of the first transfer chamber 131 may be again maintained the same as that of the first flip chamber 140. At this time, the substrate 210 may be transferred from the first transfer chamber 131 into the first flip chamber 140. When the inner pressure of the first transfer chamber 131 is the same as that of the first flip chamber 140, for example, the first door 142 may be opened. At this time, the robot arm of the first transfer chamber 131 may transfer the substrate 210 from the first transfer chamber 131 into the first flip chamber 140 such that the substrate 210 may be mounted on the first clamp 143a of the first flip chamber 140.

When the process is completed, the first cylinder 143d may be driven to move the first connecting member 143e connected to the first cylinder 143d and thus move the second clamp 143d toward the substrate 210. The second clamp 143b may clamp an edge portion of the substrate 210 together with the first clamp 143a. At this time, one end of the first cylinder 143d may release the clamping with the first connecting member 143e to separate the second clamp 143b from the first cylinder 143d. When the process is completed, the first rotational shaft may be connected to at least one of the first clamp 143a and the second clamp 143b through the first force applying unit 144b. At this time, the first rotational shaft may be connected to the first rotation driving unit 144a. When the first rotational shaft is connected to at least one of the first clamp 143a and the second clamp 143b, the first rotation driving unit 144a may be driven to rotate at least one of the first clamp 143a and the second clamp 143b. At this time, the first clamp 143a and the second clamp 143b may be rotated at the same time according to the operation of the first rotation driving unit 144a. The substrate 210 may rotate together with the first clamp 143a and the second clamp 143b, so that the first organic layer 232 may be inverted downward.

When the process is completed, the first force applying unit 144b may be driven to separate the first rotational shaft from at least one of the first clamp 143a and the second clamp 143b. The first cylinder 143d connected to the first clamp 143a may be driven to connect the first clamp 143a to the first connecting member 143e. At this time, the first connecting member 143e may linearly move the first clamp 143a by the operation of the first cylinder 143d. The first clamp 143a may be separated from the substrate 210 by the operation of the first cylinder 143d to release the clamping with the substrate 210. When the clamping of the substrate 210 by the first clamp 143a and the second clamp 143b is released, for example, the robot arm of the first transfer chamber 131 may transfer the substrate 210 in the first flip chamber 140 into the first transfer chamber 131 through the opening 141a.

Therefore, the first flip chamber 140 may invert the substrate 210 such that an upward deposition process may be performed in the sputtering chamber 132 and the monomer deposition chamber 134 and then a downward deposition process may be performed in the CVD chamber 136 and the ALD chamber 137. In this regard, downward deposition may be a process of placing the light-emission unit 220 formed in the substrate 210 to face a bottom surface of each chamber, moving a deposition material from a bottom side of each chamber to a top side thereof, and depositing the deposition material onto the light-emission unit 220, whereas, upward deposition may be a process of placing the light-emission unit 220 formed in the substrate 210 to face a top surface of each chamber, moving the deposition material from the top side of each chamber to the bottom side thereof, and depositing the deposition material onto the light-emission unit 220.

When the process is completed, after the inner pressure of the first transfer chamber 131 is made to be the same as that of the CVD chamber 136, the substrate 210 may be transferred from the first transfer chamber 131 into the CVD chamber 136. At this time, in the CVD chamber 136, the substrate may be aligned with the mask. Thereafter, a conductance control valve connected to a high vacuum pump may be completely closed, a discharge gas of Ar may be injected into a plasma generating unit while the vacuum degree may be maintained in a range of about 1-200 Pa, and power may rise up to about 3-5 W/cm$^2$ to generate plasma. At this time, the pressure may be kept in a range of about 1-200 Pa by supplying a reaction material, a reaction gas, and a carrier gas through the plasma generation source. The reaction material may be injected into a plasma region to form radicals (SiN generation gas: use of $SiH_4/NH_3/N_2/H_2/Ar$). A deposition process is performed under an environment described herein. The deposition rate may be maintained within about 200 nm/min, and gases of $SiH_4$ (about 50-500 sccm)/$NH_3$ (about 300-200 sccm)/$N_2$ (about 300-2000 sccm) may be successively supplied. When the process is performed and thus the second inorganic layer 233 reaches a target thickness, for example, the supply of the gases contributing to the reaction may stop and the plasma power drops step-by-step to about 1 W/cm$^2$. Thereafter, the substrate 210 may be detached from the mask and then may be moved to a position where the substrate 210 may be discharged.

When the process is completed, the substrate 210 may be transferred from the CVD chamber 136 into the first transfer chamber 131. At this time, the inner pressure of the CVD chamber 136 may be made to be the same as that of the first transfer chamber 131. After the substrate 210 is introduced the first transfer chamber 131, the inner pressure of the first transfer chamber 131 may be made to be the same as that of the CVD chamber 137. At this time, the substrate 210 may be transferred from the first transfer chamber 131 to the ALD chamber 137. In the ALD chamber 137, a third inorganic layer 234 may be formed on the second inorganic layer 233.

When the process is completed, a thin film encapsulation layer 230 may be formed so as to cover the light-emitting unit 220, thereby manufacturing a display apparatus 200. Thereafter, the inner pressure of the ALD chamber 137 may be maintained the same as that of the first transfer chamber 131, and the display apparatus 200 may be transferred from the ALD chamber 137 into the first transfer chamber 131. The first transfer chamber 131 may transfer the substrate 210 into the first buffer chamber 120 and the first buffer chamber 120 may transfer the substrate 210 into the loading chamber 110 to unload the display apparatus 200, the same as or similarly as described herein.

After the display apparatus 200 is manufactured, the display apparatus 200 may be transferred from the first transfer chamber 131 into the first flip chamber 140, may be inverted, and may be unloaded to outside the apparatus through the first transfer chamber 131, the first buffer chamber 120, and the loading chamber 110. The display apparatus 200 may be unloaded through the unloading chamber formed separately, or the display apparatus 200 may be inverted in the first flip chamber 140 and then may be unloaded to outside of the apparatus through the first transfer chamber 131 and the unloading chamber.

In the case where the first inorganic layer 231, the first organic layer 232, the second inorganic layer 233, and the third inorganic layer 234 are formed, the second buffer chamber 135 may temporarily store the substrate 210. For example, when a malfunction occurs in one or more of the sputtering chamber 132, the monomer deposition chamber 134, the CVD chamber 136, and the ALD chamber 137, the second buffer chamber 135 may temporarily store the substrate 210 to thus secure a line balance of the thin film encapsulation layer manufacturing apparatus 100. Therefore, the thin film encapsulation layer manufacturing apparatus 100 and the method of manufacturing a display apparatus may save time for forming the thin film encapsulation layer 230 and simplifying the configuration of the thin film encapsulation layer manufacturing apparatus 100 by performing all the processes in a single cluster. The thin film encapsulation layer manufacturing apparatus 100 and the method of manufacturing a display apparatus may increase the productivity by sequentially forming the thin film encapsulation layer 230 in the upward and downward deposition and then directly unloading the display apparatus 200.

Figure 4:
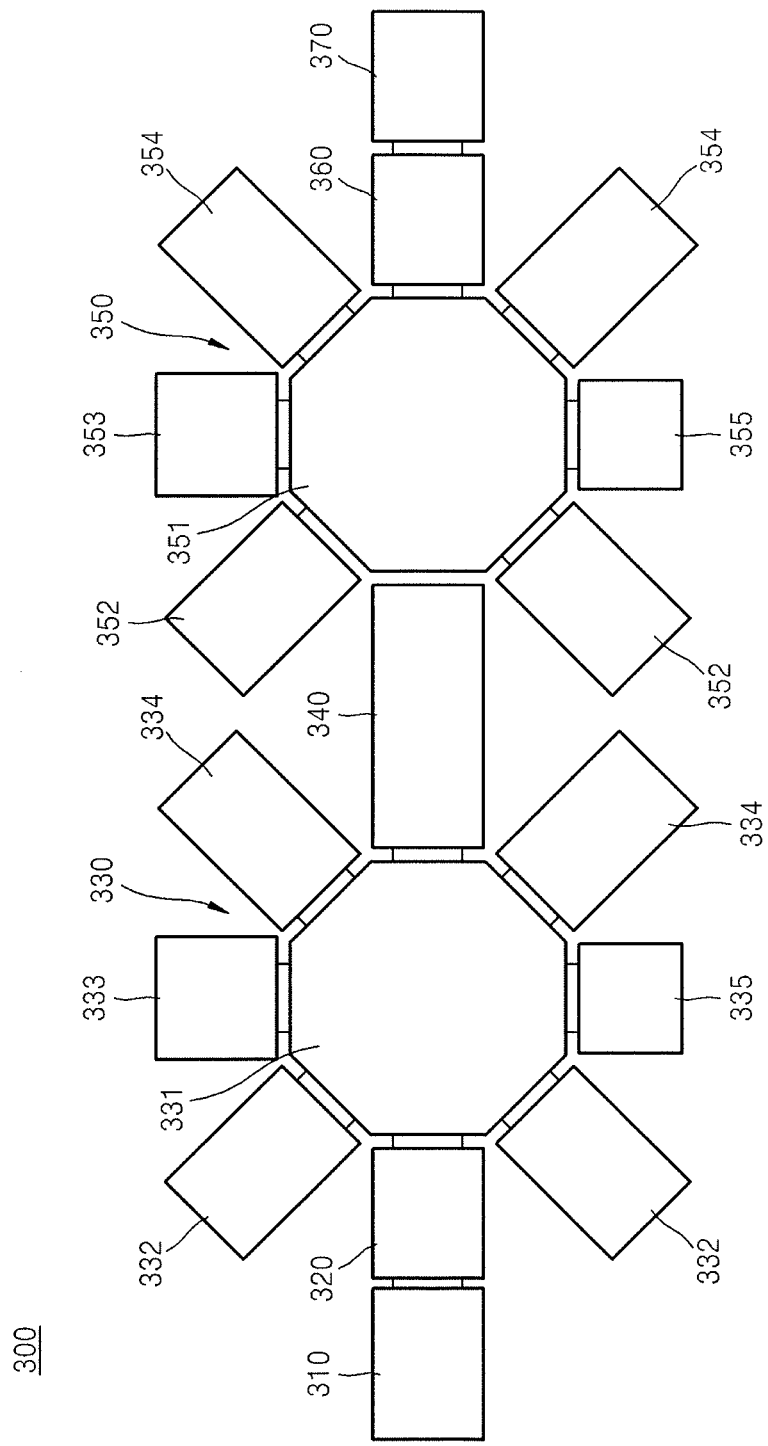
FIG. 4 illustrates a schematic view of a thin film encapsulation layer manufacturing apparatus.

FIG. 4 illustrates a schematic view of a thin film encapsulation layer manufacturing apparatus 300. Referring to FIG. 4, the thin film encapsulation layer manufacturing apparatus 300 may include a loading chamber 310, a first buffer chamber 320, a first cluster 330, a second cluster 350, a first flip chamber 340, a second flip chamber 360, and an unloading chamber 370. The loading chamber 310, the first buffer chamber 320, and the unloading chamber 370 may be the same as or similar to those described with reference to FIG. 3. For convenience of explanation, detailed description is made with reference to the case where the loading chamber 310 and the unloading chamber 370 are formed separately from each other.

The first cluster 330 may include one or more of a first transfer chamber 331, a sputtering chamber 332, a first mask stock chamber 333, a monomer deposition chamber 334, and a second buffer chamber 335. The first transfer chamber 331, the sputtering chamber 332, and the second monomer deposition chamber 334 each may be provided in plurality. The first transfer chamber 331, the sputtering chamber 332, the first mask stock chamber 333, the monomer deposition chamber 334, and the second buffer chamber 335 may be the same as or similar to the first transfer chamber 131, the sputtering chamber 132, the first mask stock chamber 133, the monomer deposition chamber 134, and the second buffer chamber 135 described with reference to FIGS. 1 through 3. The first flip chamber 340 may connect the first cluster 330 and the second cluster 350. The first flip chamber 340 may include a first chamber body unit, a first clamping unit, and a substrate rotating unit. The first chamber body unit, the first clamping unit, and the substrate rotating unit may be the same as or similar to those described with reference to FIGS. 1 through 3.

The second cluster 350 may include one or more of a second transfer chamber 351, a chemical vapor deposition (CVD) chamber 352, a second mask stock chamber 353, at atomic layer deposition (ALD) chamber 354, and a third buffer chamber 355. The CVD chamber 352 and the ALD chamber 354 may be provided in plurality. The second transfer chamber 351, the CVD chamber 352, the second mask stock chamber 353, the ALD chamber 354, and the third buffer chamber 355 may be the same as or similar to the first transfer chamber 131, the CVD chamber 136, the first mask stock chamber 133, the ALD chamber 137, and the second buffer chamber 135 described with reference to FIGS. 1 through 3. The second flip chamber 360 may be connected to the second transfer chamber 351. The second flip chamber 360 may include a second chamber body unit, a second clamping unit, and a second substrate rotating unit. For example, the second chamber body unit, the second clamping unit, and the second substrate rotating unit may be the same as or similar to the first chamber body unit 141, the first clamping unit 143, and the substrate rotating unit 144 of the first flip chamber 140.

A method of forming a thin film encapsulation layer 230 through the thin film encapsulation layer manufacturing apparatus 300 may be performed the same as or similarly to the previous description. A substrate 210 formed with a light-emitting unit 220 may be loaded into the loading chamber 310, and transferred into the first transfer chamber 331 via the first buffer chamber 320. The first transfer chamber 331 may transfer the substrate 210 into the sputtering chamber 332, and the sputtering chamber 332 may form a first inorganic layer 231 on the light-emitting unit 220 through a sputtering process.

When the process is completed, the substrate 210 may be introduced into the monomer deposition chamber 334 from the sputtering chamber 332 via the first transfer chamber 331 to form a first organic layer 232 on the first inorganic layer 231. The substrate 210 may be transferred from the monomer deposition chamber 334 into the first transfer chamber 331, and may be transferred from the first transfer chamber 331 into the first flip chamber 340. After the substrate 210 is transferred, the first flip chamber 340 may invert the substrate 210. The substrate 210 on which the first inorganic layer 231 and the first organic layer 232 may be deposited downward in the sputtering chamber 332 and the monomer deposition chamber 334 may be inverted in the first flip chamber 340 and may be transferred into the second transfer chamber 351. The first organic layer 232 formed on the substrate 210 may be disposed facing a lower side of the second transfer chamber 351. The second transfer chamber 351 may transfer the substrate 210 into the CVD chamber 352. The CVD chamber 352 may form a second inorganic layer 233 on the first organic layer 232, as in the CVD chamber 136 described with reference to FIGS. 1 through 3.

When the process is completed, the substrate 210 may be transferred from the CVD chamber 352 into the ALD chamber 354 via the second transfer chamber 351. The ALD chamber 354 may form a third inorganic layer 234 on the second inorganic layer 233, and a method of forming the third inorganic layer 234 may be the same as or similar to the method of forming the third inorganic layer 234 in the ALD chamber 137 described with reference to FIGS. 1 through 3.

When the process is completed, a display apparatus 200 having the thin film encapsulation layer 230 including the third inorganic layer 234 formed on the second inorganic layer 233 may be manufactured. The display apparatus 200 may be transferred from the ALD chamber 354 into the second flip chamber 360 via the second transfer chamber 351. The second flip chamber 360 may once again invert the display apparatus 200. A method of inverting the display apparatus 200 at the second flip chamber 360 may be the same as or similar to the method of inverting the substrate 210 at the first flip chamber 340. When the second flip chamber 360 inverts the display apparatus 200, the display apparatus 200 may be disposed such that the third inorganic layer 234 faces an upper side of the second flip chamber 360. At this time, the second flip chamber 360 may transfer the display apparatus 200 into the unloading chamber 370, and the unloading chamber 370 may unload the display apparatus 200 to outside of the apparatus.

In addition to the transferring the display apparatus 200 into the unloading chamber 370 via the second flip chamber 360, it is also possible to unload the display apparatus 200 to outside the apparatus via the second transfer chamber 351, the first flip chamber 340, the first transfer chamber 331, the first buffer chamber 320, and the loading chamber 310. At this time, the first flip chamber 340 may invert the display apparatus 200 and transfer the inverted display apparatus 200 into the first transfer chamber, like the second flip chamber 360. It is also possible to unload the display apparatus 200 to the outside in a state where the display apparatus 200 is not inverted by the second flip chamber 360. At this time, the second flip chamber 360 might not be present, and it is possible that the unloading chamber 370 is connected to the third buffer chamber 355 or a separate buffer chamber and the display apparatus 200 is unloaded to the outside via the unloading chamber 370.

The connections between chambers may be physical in nature and may be direct or indirect. For example the connection between the first transfer chamber and the other chambers can have no intervening chambers and/or other components, or may have one or more intervening chambers and/or other components. Similarly, transfer of a substrate from one chamber to another chamber may be direct or indirect. For example, a substrate can pass directly from one chamber in which a prior step has been performed to another chamber in which a subsequent step is performed. Alternatively, a substrate can pass through one or more intervening chambers, for example, a transfer chamber, when moving from a prior process chamber to a later process chamber.

By way of summation and review, a thin film encapsulation layer manufacturing apparatus and a method of manufacturing a display apparatus using the same may maximize the work productivity by reducing the working time. The thin film encapsulation layer manufacturing apparatus and the method of manufacturing a display apparatus may save time for forming the thin film encapsulation layer and simplify the configuration of the thin film encapsulation layer manufacturing apparatus by performing all the processes in a single cluster. The thin film encapsulation layer manufacturing apparatus and the method of manufacturing a display apparatus may increase the productivity by sequentially forming the thin film encapsulation layer in the upward and downward deposition and then directly unloading the display apparatus. Further, the thin film encapsulation layer manufacturing apparatus and the method of manufacturing a display apparatus may reduce working time and maximize the productivity by unloading the display apparatus formed with the thin film encapsulation layer via the unloading chamber. Moreover, the thin film encapsulation layer manufacturing apparatus 300 and the method of manufacturing a display apparatus may perform a work rapidly and concisely by forming the thin film encapsulation layer in an in-line sequence.

Example embodiments have been disclosed herein, and although specific terms are employed, they are used and are to be interpreted in a generic and descriptive sense only and not for purpose of limitation. Features, characteristics, and/or elements described in connection with a particular embodiment may be used singly or in combination with features, characteristics, and/or elements described in connection with other embodiments unless otherwise specifically indicated. Accordingly, various changes in form and details may be made without departing from the spirit and scope of the present disclosure as set forth in the following claims.

What is claimed is:
1. A method of manufacturing a display apparatus, the display apparatus including a pixel electrode, an emission layer, and an opposite electrode, stacked, in that order, on a substrate, the method comprising:
    forming a first inorganic layer directly on the opposite electrode on the substrate through a sputtering process in a sputtering chamber by downward deposition;
    transferring the substrate from the sputtering chamber through a transfer chamber and into a monomer deposition chamber;
    forming a first organic layer directly on the first inorganic layer through a monomer deposition process in the monomer deposition chamber by downward deposition;
        wherein the sputtering chamber and the monomer deposition chamber are directly connected to the transfer chamber such that transferring the substrate from the sputtering chamber to the monomer deposition chamber includes changing a pressure in the sputtering chamber to be the same as a pressure of the entire transfer chamber after forming the first inorganic layer,
    transferring the substrate from the monomer deposition chamber through the transfer chamber and into a first flip chamber;
    inverting the substrate in the first flip chamber by a first clamping unit and a substrate rotation unit;
    transferring the inverted substrate from the first flip chamber through the transfer chamber and into a chemical vapor deposition (CVD) chamber;
    forming a second inorganic layer directly on the first organic layer through a CVD process in the CVD chamber by upward deposition;
    transferring the inverted substrate from the CVD chamber through the transfer chamber and into an atomic layer deposition (ALD) chamber; and
    forming a third inorganic layer directly on the second inorganic layer through an ALD process in the ALD chamber by upward deposition,
    wherein the first flip chamber includes:
        a first chamber body unit having a space formed therein and an opening configured for insertion or withdrawal of the substrate;
        the first clamping unit within the first chamber body unit configured to clamp or release the substrate; and
        the substrate rotating unit configured to rotate the substrate clamped by the first clamping unit.
2. The method as claimed in claim 1, wherein forming the second inorganic layer on the first organic layer through the CVD process in the CVD chamber by upward deposition includes maintaining a pressure in the CVD chamber in a range of about 1-200 Pa.
3. The method as claimed in claim 1, further comprising supplying a mask from a mask stock chamber to at least one of the sputtering chamber, the monomer deposition chamber and the chemical vapor deposition chamber, wherein the mask stock chamber is directly connected to the transfer chamber.

* * * * *